United States Patent
Schluter (10) Patent No.: US 7,719,835 B1
(45) Date of Patent: May 18, 2010

(54) WIRING DISTRIBUTION DEVICE FOR AN ELECTRONICS RACK

(75) Inventor: Robert Schluter, Kinnelon, NJ (US)

(73) Assignee: Middle Atlantic Products, Inc., Fairfield, NJ (US)

( * ) Notice: Subject to any disclaimer, the term of this patent is extended or adjusted under 35 U.S.C. 154(b) by 0 days.

(21) Appl. No.: 12/319,260

(22) Filed: Jan. 5, 2009

(51) Int. Cl.
*H05K 7/20* (2006.01)

(52) U.S. Cl. .............. 361/695; 361/724; 361/110; 174/17 R; 174/50; 174/50.52; 454/184

(58) Field of Classification Search ............ 361/110, 361/111, 115, 42, 93.1, 601, 614, 622, 624, 361/641, 644, 648, 657, 678, 688–697, 720–727, 361/679.46, 679.48; 174/50, 53, 50.52, 58–60, 174/64, 101, 48, 49, 70 C, 72 C; 454/184; 307/11, 18, 126, 141, 141.4, 143, 34, 32; 337/186, 189; 312/223.1, 223.2, 223.3, 265.1, 312/265.3, 265.5
See application file for complete search history.

(56) References Cited

U.S. PATENT DOCUMENTS

| | | | |
|---|---|---|---|
| 4,691,274 A * | 9/1987 | Matouk et al. ............ 363/141 |
| 5,173,819 A * | 12/1992 | Takahashi et al. ........ 360/97.03 |
| 6,301,095 B1 * | 10/2001 | Laughlin et al. ............ 361/624 |
| 6,331,933 B1 * | 12/2001 | Rumney ...................... 361/622 |
| 6,496,366 B1 * | 12/2002 | Coglitore et al. ....... 361/679.46 |
| 7,173,821 B2 * | 2/2007 | Coglitore .................... 361/695 |
| 7,255,640 B2 * | 8/2007 | Aldag et al. ................ 454/184 |
| 7,420,805 B2 * | 9/2008 | Smith et al. ............ 361/679.48 |
| 7,619,868 B2 * | 11/2009 | Spitaels et al. .............. 361/115 |
| 7,622,673 B2 * | 11/2009 | Quijano ...................... 174/50 |
| 2009/0021925 A1 * | 1/2009 | Heimann et al. ............ 361/818 |

OTHER PUBLICATIONS

"DWR Series Wall Cabinet, Wall Mount Sectional Cabinet with Enhanced Cable Management", 2008-2009 Master Catalog, p. 40, May 2008.
"EWR Series Wall Cabinet, Aggressively Priced Sectional Wall Cabinet for Smaller Systems", 2008-2009 Master Catalog, p. 42, May 2008.
"IDF Series Intermediate Distribution Rack, Intermediate Distribution Rack Mounts to Building Truss", 2008-2009 Master Catalog, p. 44, May 2008.
"Universal Enclosure Options", 2008-2009 Master Catalog, p. 28, May 2008.
"Thermostatic Fan Controls and Rack Top Options", 2008-2009 Master Catalog, p. 84-85, May 2008.
"VMRK Series Extra Tall Rack Enclosure", 2008-2009 Master Catalog, p. 22-23, May 2008.

* cited by examiner

*Primary Examiner*—Michael V Datskovskiy
(74) *Attorney, Agent, or Firm*—Drinker Biddle & Reath LLP (57) ABSTRACT

A wiring and power distribution device for a cabinet housing electronic equipment. The distribution device includes a plurality of compartments. Each compartment adapted to contain an electronic component, such as an uninterruptible power supply, a power-conditioning device, or a power distribution center containing circuit breakers. The distribution device also includes a cooling compartment, including a fan or passive convective chimney arranged to cool the interior of the cabinet with ambient air. The distribution device provides a single input point for power and signal wiring, and at least one output point for connection to the electronic devices contained within the cabinet.

14 Claims, 7 Drawing Sheets

WIRING DISTRIBUTION DEVICE FOR AN ELECTRONICS RACK

FIELD OF THE INVENTION

The present invention relates generally to electronics racks, and particularly, to systems for providing power, temperature, and wiring management to components mounted in such racks.

BACKGROUND OF THE INVENTION

It is known to provide a rack or cabinet in which electronic components may be mounted. Existing racks may provide surge suppressors or power strips integrated into the rack; components may be plugged into these strips to make movement of the rack or cabinet more convenient. However, components mounted in such cabinets must still be wired individually to one another and to a power source which is typically located external to the rack or enters the rack from multiple locations.

Also, installation personnel must connect wiring to the rack or cabinet, as well as the components, in the field, after the electronic components are integrated into the cabinet. The field installation personnel must then work inside the cabinet to interconnect the components.

Current wiring systems are not well coordinated or designed for ease of installation and consistency, while also permitting ready access to wired components.

A need, therefore, exists for a wiring distribution device that provides central wire management of components for ease of installation in the field.

SUMMARY OF THE INVENTION

The invention is directed to a wiring distribution device for electronic racks or cabinets. The distribution device is mounted to the rack or cabinet, and includes modules adapted to provide both internal and external wiring and cable connection and management as required by a particular application. The modules may include an uninterruptible power supply (UPS), a UPS battery, power distribution (such as circuit breakers), power filtering, power surge and spike protection, power conditioning, entry and routing management for wiring and cables, including electrical or fiber-optic cable, electromagnetic (EM) shield panels, and a cooling module which may be passive or active. The cooling module preferably includes at least one fan and a temperature sensor, and is adapted to direct airflow through the cabinet to maintain the interior of the cabinet at a desired temperature.

Other objects, aspects and advantages of the present invention will become apparent to those skilled in the art upon reading the following detailed description, when considered in conjunction with the appended claims and the accompanying drawings briefly described below.

BRIEF DESCRIPTION OF THE DRAWINGS

For the purpose of illustrating the invention, there are shown in the drawings embodiments that are presently preferred; it being understood, however, that this invention is not limited to the precise arrangements and constructions particularly shown. In the drawings.

DETAILED DESCRIPTION OF THE PREFERRED EMBODIMENTS

Referring now to the drawings which illustrate several preferred embodiments of the invention, a wiring distribution device is shown for use on an electronics rack. As will be discussed in more detail below, the distribution device preferably includes a high voltage (class 1 wiring) side, a low-voltage (class 2 wiring) side, a cooling device, a power distribution device, and power conditioning device.

Figure 1:
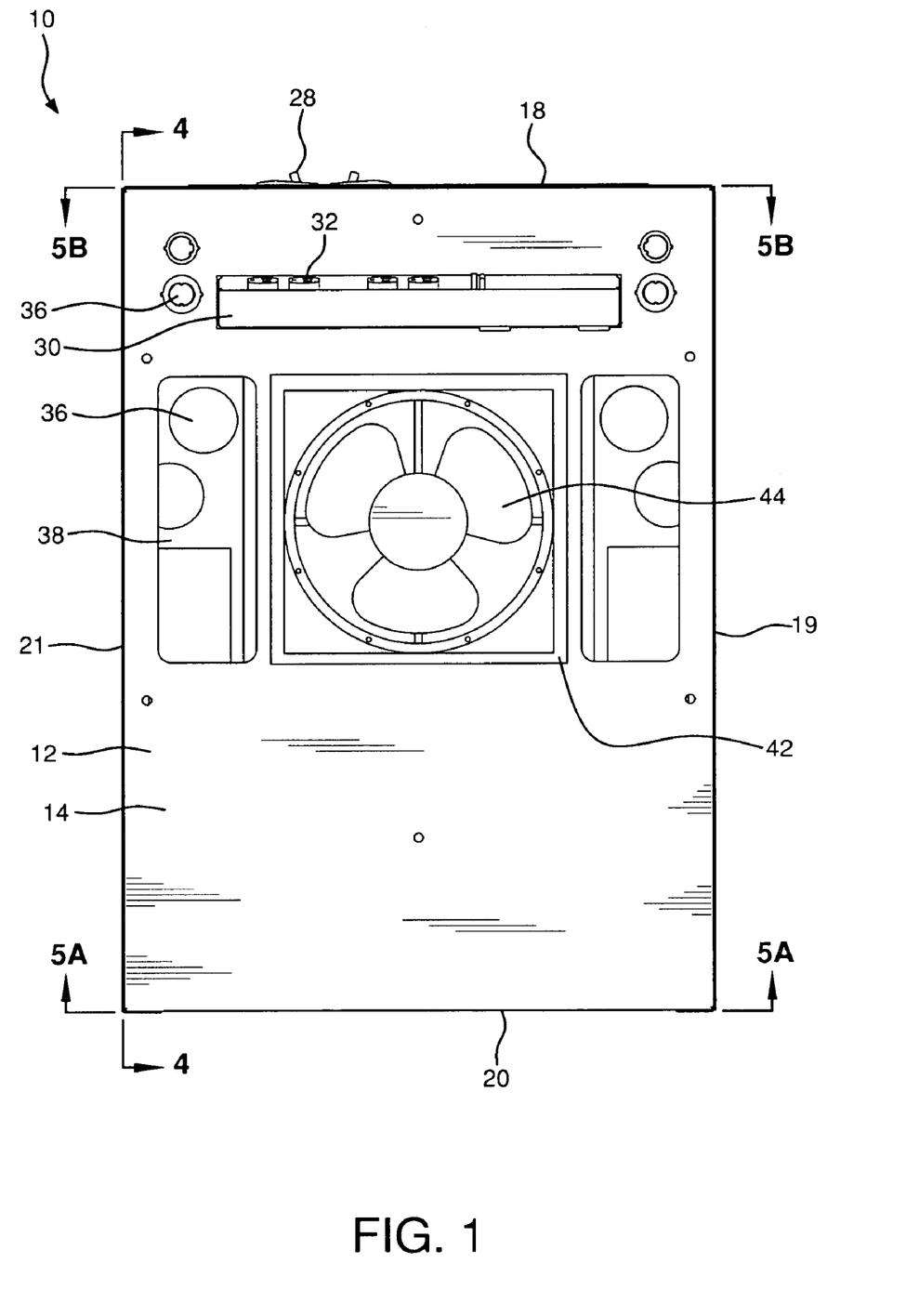
FIG. 1 is a bottom view of an embodiment of the wiring distribution device of the present invention.
Figure 2:
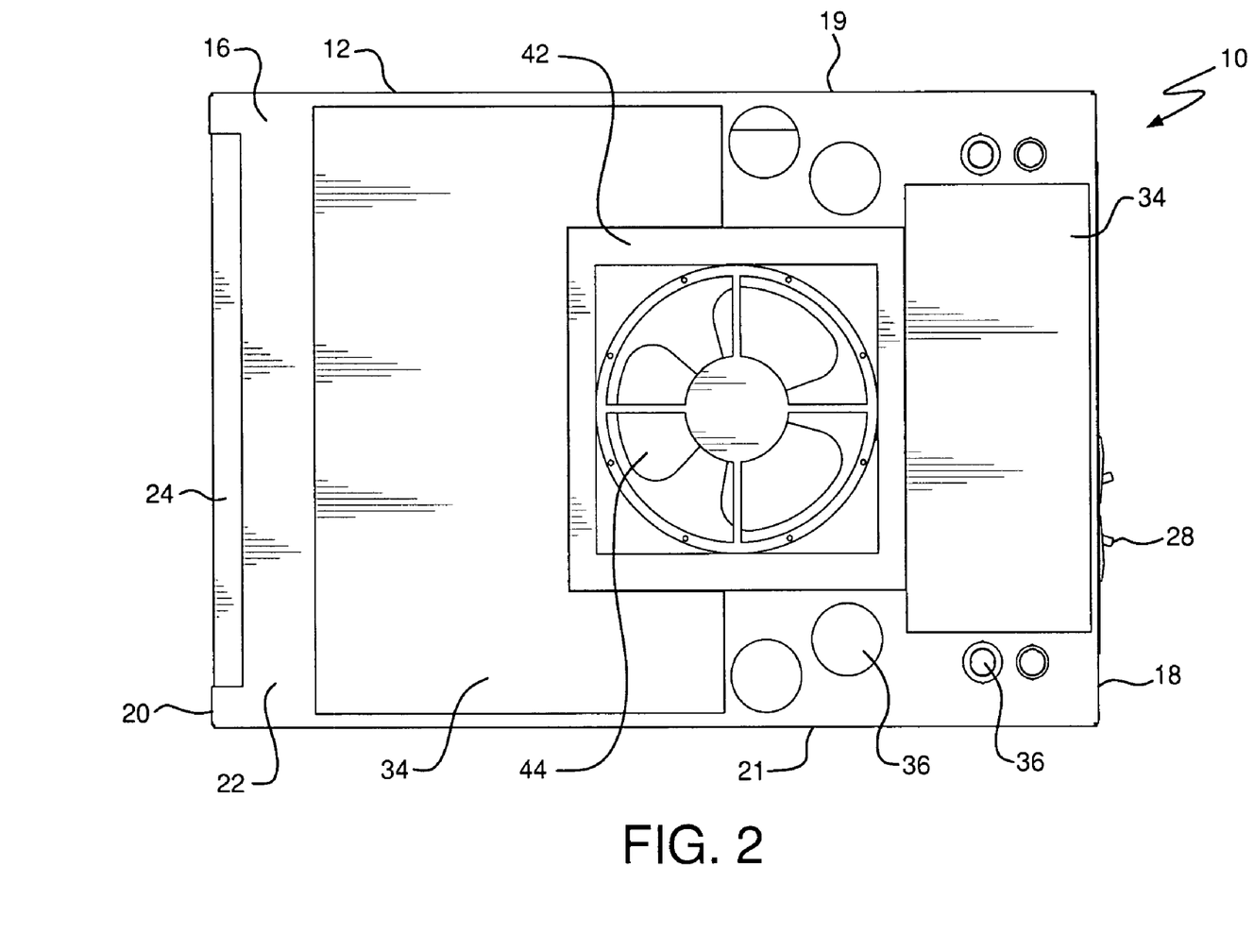
FIG. 2 is a top view of the wiring distribution device of FIG. 1.

FIGS. 1 and 2 are bottom and top views, respectively, of the wiring distribution device 10, which preferably mounts to the top of a rack or cabinet containing electronic devices (not shown). The distribution device includes a housing 12, which has a bottom 14, a top 16, front and rear faces or walls 18 and 20, respectively, and side walls, 19, 21. The housing 12 preferably includes upper and lower sections, which together define an enclosure with an interior that includes at least two internal chambers or compartments 26. The lower section 24 in the illustrated embodiment of FIGS. 6A and 6B includes the bottom 14, one of either the front or back walls, and one or more flanges 15 extending vertically upward from one or more edges so as to form a tray. The upper section 22 in the illustrated embodiment is defined by the top 16, side walls 19, 21 and one of the front or rear walls 18, 20. The upper and lower sections are constructed so as to form the housing and define internal compartments when assembled. Although the housing preferably includes upper an lower sections, as will be apparent to those skilled in the art, the housing could be constructed from individuals components and assembled into a housing with suitable internal compartments. The upper and lower sections can be formed from any of the various walls or surfaces of the housing. As will be discussed in more detail below, the compartments are configured to contain support components and provide for wiring and component management. The housing may be constructed of any material suitable for enclosing electrical components or electronic devices, including metal or plastic, and in the illustrated embodiment is preferably made from sheet metal components.

Figure 3:
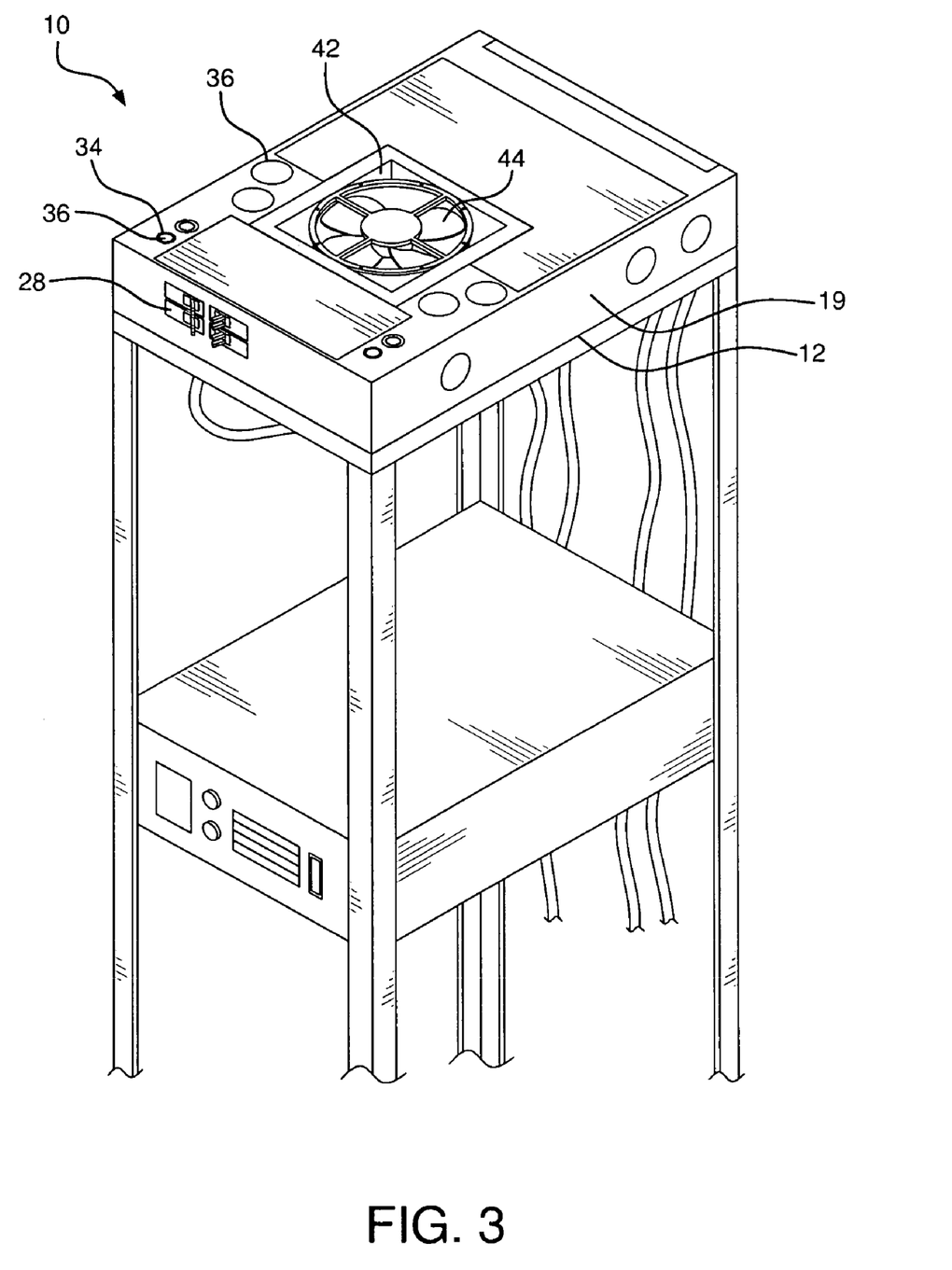
FIG. 3 is an isometric view of the distribution device of FIG. 1.
Figure 4:
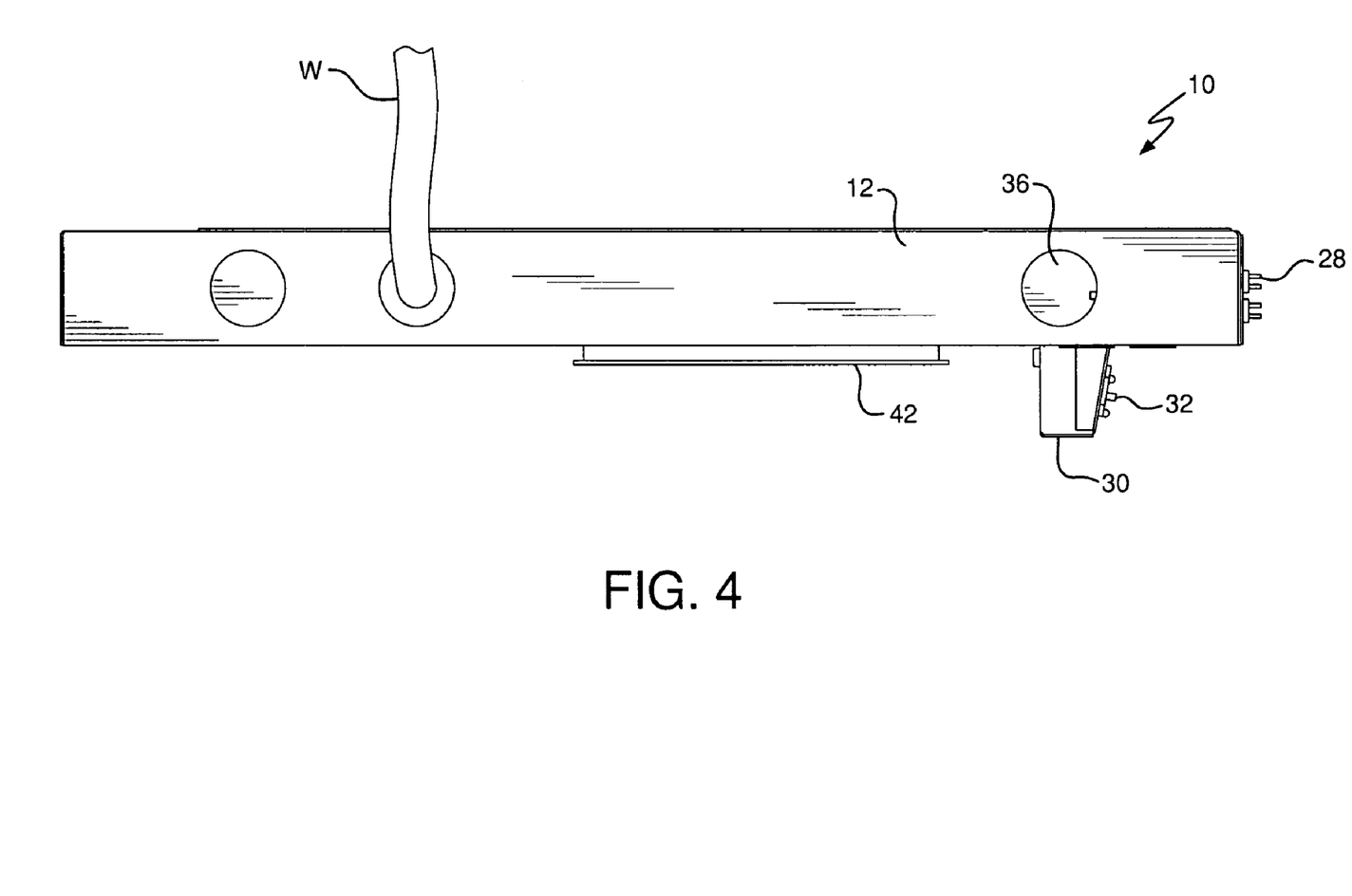
FIG. 4 is a side view of the distribution device of FIG. 1, seen along lines 4-4.
Figure 5A:
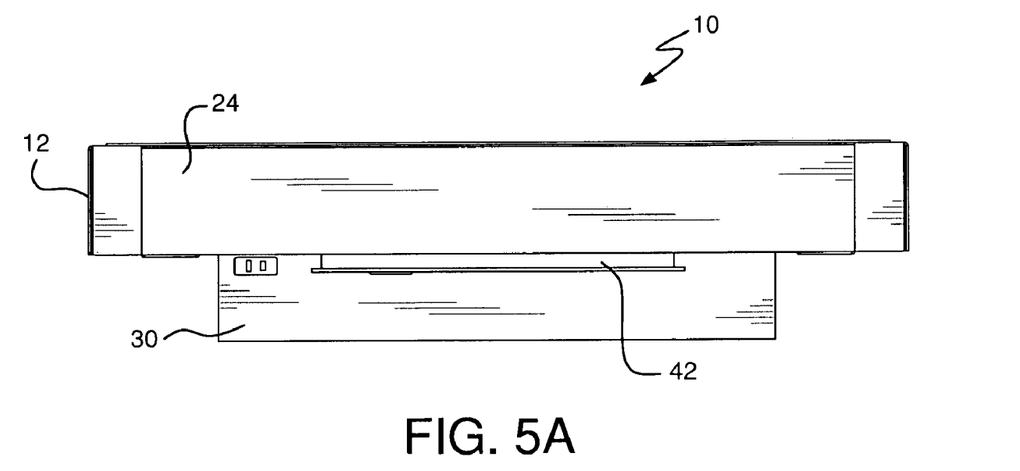
FIG. 5A shows a back view of the distribution device of FIG. 1, seen along lines 5A-5A.
Figure 5B:
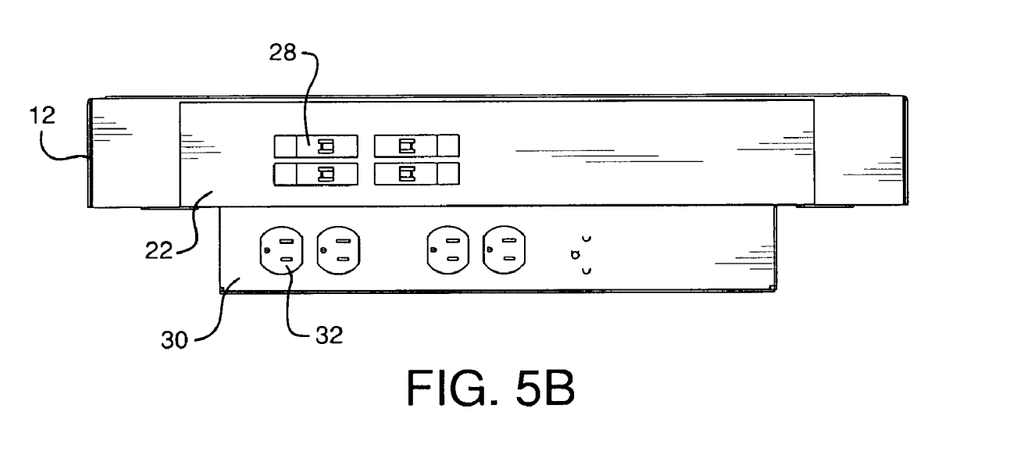
FIG. 5B shows a front view of the distribution device of FIG. 1, seen along lines 5B-5B.
Figure 6A:
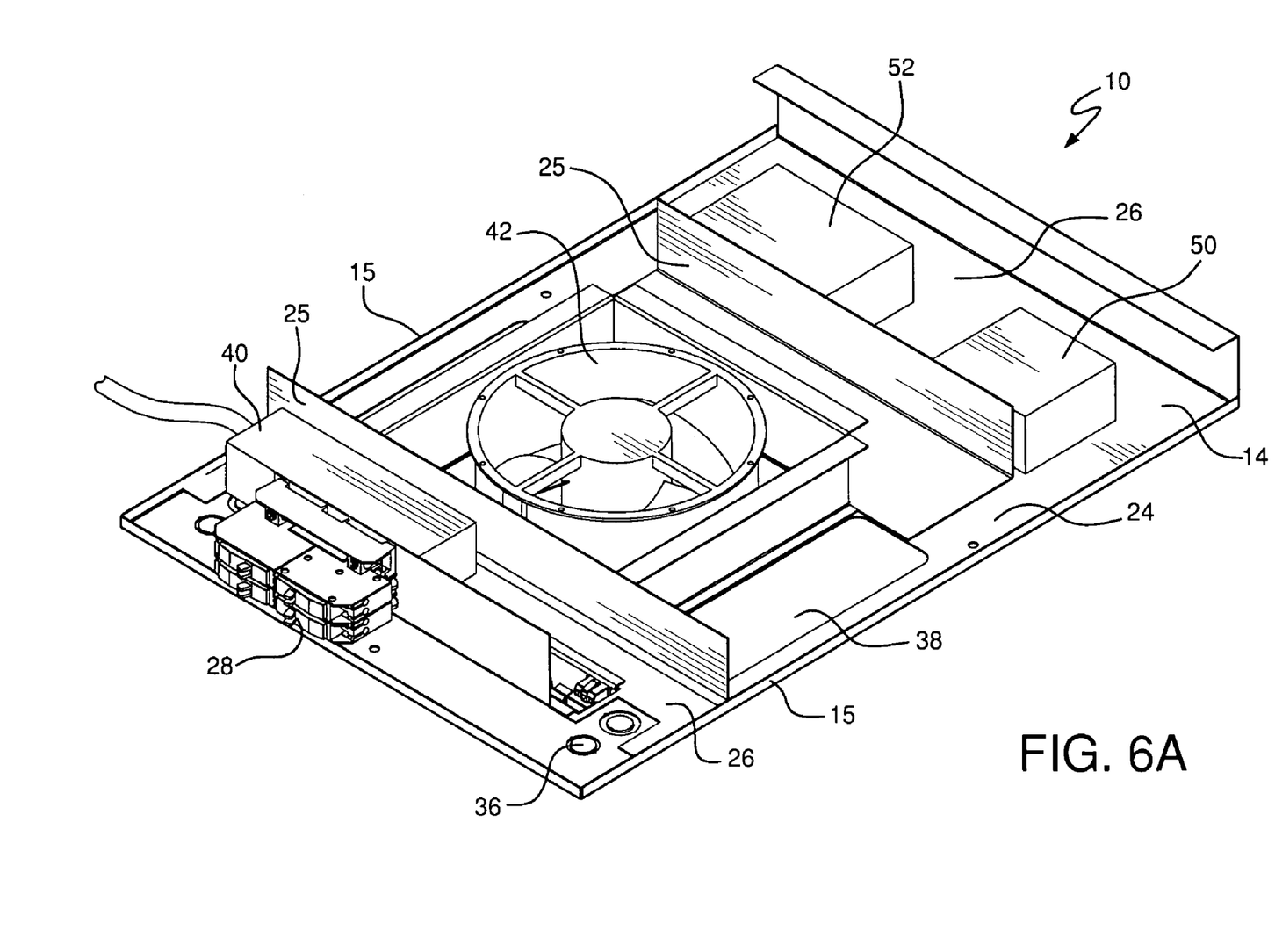
FIG. 6A shows an isometric view of the distribution device of FIG. 2, with the top section of the housing removed.

The distribution device preferably includes a surge protection device, which serves to protect one or more user added components that are added to the rack from damage due to surges or spikes in the electric current supplied to the distribution device 10. The surge protection device preferably includes at least one, and more preferably more than one, circuit breaker 28, as seen in FIGS. 3, 5B, and 6A. The surge protection device is electrically connected to a wiring output point, such as power strip 30, which preferably includes a plurality of outlets 32, as seen in FIGS. 1 and 5B. The outlets are preferably standard three-prong electrical outlets, but may be of any configuration suitable for connecting a desired electrical device. As shown, the circuit breakers 28 are preferably mounted onto one of the walls of the housing so as to be easily viewable. In the illustrated embodiment, the circuit breakers are shown on the front wall 19 of the distribution device. However, if the device is to be used with a home electronics rack, the circuit breakers 28 may be located on the sides or rear of the housing to obscure view of the breakers. Alternatively, the circuit breakers can be replaced with fuses positioned within a compartment within the housing with an access panel obscuring view of the over-current protection devices.

The outlets 32 and/or the power strip 30 are preferably mounted to the device so as to be accessible from the bottom of the distribution device 10. As noted above, the distribution device is designed for placement on the top of conventional vertical racks, such as EIA standard racks. Such racks generally include a top plate that is fastened to the vertical and horizontal frame structure to close off the top. When the present invention is employed on such a rack, the top plate of the rack is removed, thus permitting access to the bottom of the distribution device 10 through the top of the rack. The outlets 32 are mounted so that they are accessible from the bottom of the distribution device. In the illustrated embodiment, the power strip and/or outlets protrude downward from the bottom of the housing. However, it is also contemplated that the power strip and/or outlets could be mounted within the housing with the receptacles accessible from the bottom of the housing. The outlets and/or power strip can be located slightly inward from the edges of the housing so that when the housing 12 is placed on top of the rack, the outlets are not obscured by the rack framing structure.

Figure 6B:
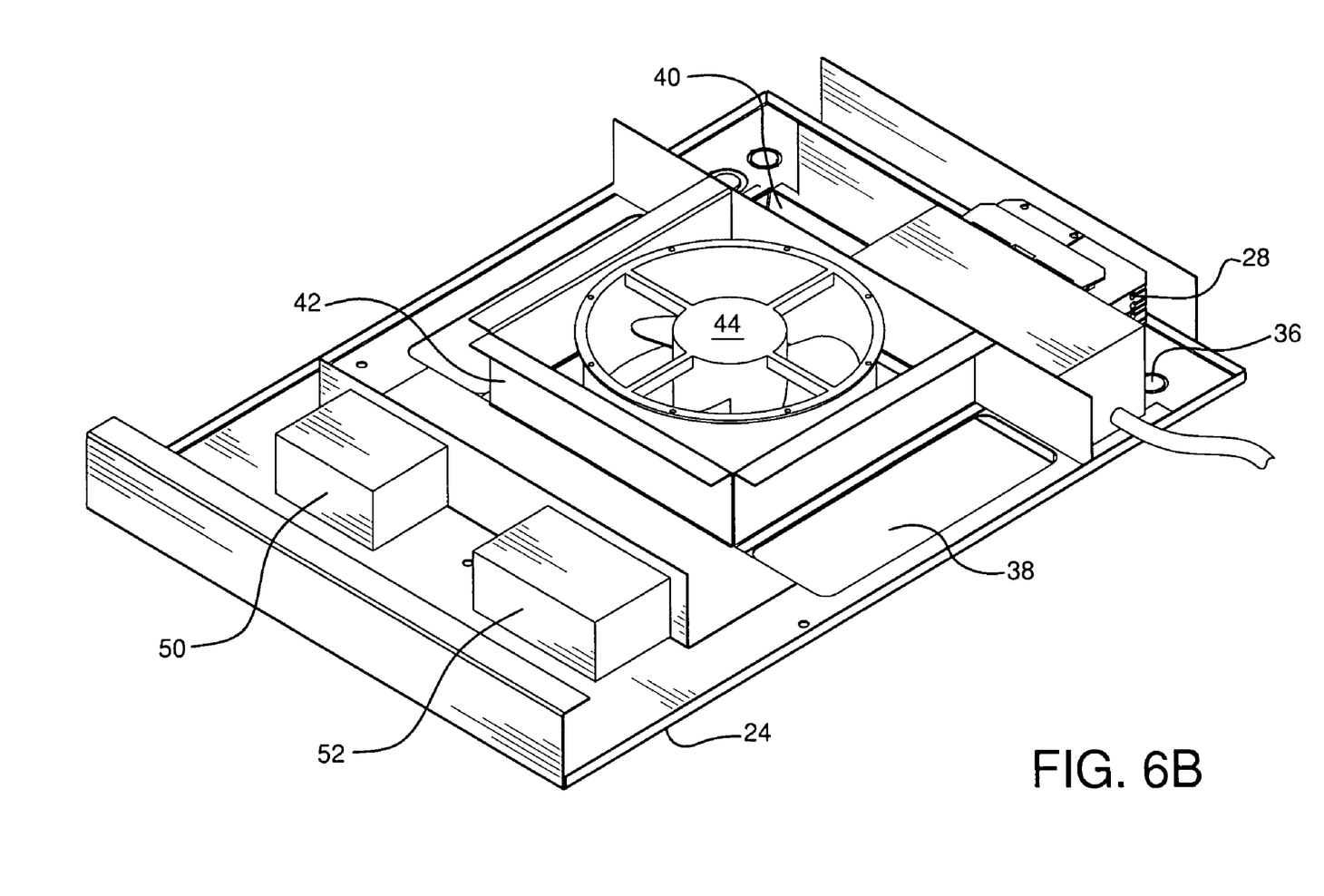
FIG. 6B shows a second isometric view of the distribution device of FIG. 2, with the top section of the housing removed.

As discussed above, the housing includes multiple internal compartments or chambers 26. Preferably the upper and lower sections of the housing are configured so as to create the internal chambers 26 when assembled. As shown in FIGS. 6A and 6B, internal walls 25 extend upward from the bottom 14 so as to separate portions of the lower section 23 into compartments or zones. As seen in FIGS. 2 and 3, some of the compartments are preferably accessible by removable covers 34, and may house any number of support components for performing various functions. Some of the compartments are preferably also or separately accessible by knock-out plugs 36 formed in the top, bottom and/or sides of the housing. The knock-out plugs may be removed in order to pass wiring W into housing, and may be designed to be either replaceable or permanently removed. The bottom section 24 of the housing also preferably includes at least one opening 38, which provides access to the inside of the housing and one or more compartments, as seen in FIGS. 1, 6A, and 6B.

The compartments 26 serve various functions. The compartments may serve as routing pathways for electronic or fiber-optic cable and wiring, or may house components for power or signal conditioning 50, power supplies such as a UPS, wiring distributions sections 52, and/or temperature or thermal control components, such as cooling fans. If any of the support component have the tendency to create electrical interference, the compartments may also include suitable EM shielding. The distribution device may also include component monitoring and control devices. Additionally, other components, such as lighting modules, may be included. The components are preferably connected by electromagnetically-shielded channels (not shown), which are preferably segregated to separate class 1 and class 2 cables.

In the illustrated embodiment, a power supply and quality module 40 is positioned adjacent to an access point, such as a knock out plug or panel, for receiving power from an external supply. In one embodiment, the power supply module 40 preferably is an integrated load center featuring at least one circuit breaker 28 or other automatic safety shutoff device, bond wire termination points, hardwired or pluggable power strips 30, local receptacles that include reusable strain relief, and a power buss. One suitable power strip that can be hardwired is the PD Series™ power strip sold by Middle Atlantic Products, Inc., Fairfield, N.J. The power input side of the device also includes a wiring input point (not shown in FIG. 6A, but could be knock-out plugs 36 in FIG. 2 or wiring ports formed in the module itself), through which the device accepts electrical current or data signals from an external source. The module is preferably configured to support various load center configurations, including direct branch circuit feeds, 120/120 with a common isolated neutral line and a split-single configuration, and a 120/120 split-neutral configuration with an isolation transformer feed and two independent secondary windings, or a single 120V feed. The power supply module preferably includes not only a UPS, but also an additional battery backup for providing limited power supply in the event of loss of the main power.

In addition to the circuit breakers, which control power supply to particular component in either the device or the cabinet, a surge suppression device is preferably included which protects the cabinet's electrical components (and/or the components in the distribution device, against power surges or spikes.

In one embodiment, the distribution device includes at least one power filtering or conditioning device 50, such as the ExactPower™ brand PowerCore a filter power conditioning product (available from Middle Atlantic Products, Inc., Fairfield, N.J.) The conditioning device is designed to reduce electrical noise on the power lines that are being either sent to or provided from the components in the cabinet. For example, the power conditioner can modify an electrical circuit prior to feeding a branch circuit.

One or more wiring distribution zones or compartments 52 are preferably included for providing a way to manage and control the distribution of select wires, such as highly sensitive audio wires that are susceptible to interference.

Also visible in FIG. 1 is the cooling module 42, which houses a cooling device, such as a fan 44, and, preferably, a temperature sensor (not shown) or a passive convection cooling chimney. The cooling device is preferably located in the middle of the distribution device, and the fan is adapted to force ambient air through the interior of the rack/cabinet on which the device is mounted, in order to maintain an optimum interior temperature. The illustrated fan is a single fan having an approximately 10 inch diameter. Alternatively, the cooling module may include a plurality of smaller fans or other cooling devices that can be mounted to the device at any suitable location, or a passive venting scheme that works by natural convection. As shown, an opening is formed in the bottom 14 of the housing 12 so that the flow of air is preferably in the substantially vertical direction, either into or out of the rack. The device may include a temperature display (not shown) that is mounted to the housing and viewable from outside the housing for depicting the temperature in the housing or, more preferably, for depicting the temperature in the rack by means of a remote temperature sensor.

The monitoring module preferably includes at least one display mounted to the housing and visible to a user from outside the housing. The display may show the temperature inside the rack or cabinet, and may include graphical data or indicator lights depicting the status of the components in the cabinet or in the housing, including voltage, current, and power quality.

The present invention contemplates that the location of the compartments and the components in the compartments, would be selected so as to distance items that are susceptible to interference from items that generate the interference. For example, audio wires (such as line-level or microphone wires) would be channeled into and out of a compartment of the distribution device that this preferably located distant from the power supply. As discussed above, it is conventional to separate class 1 and class 2 wiring to meet UL requirements. However, the present invention includes the ability to further protect from electromagnetic interference by dedicated partitioning of the two classes of wires, thus providing further shielding.

It is quite common in the industry to bay or gang multiple racks side by side in a row. To assist in wiring such ganged units, the present invention includes a segregated horizontal pathway for wires (power, signal and control) to be run between the bayed racks, without impeding the open space inside the rack as with conventional horizontal runs of wires. The wiring from one top distribution device is directed to adjacent wire distribution devices, without using internal areas of the rack.

It will be apparent to those skilled in the art that various modifications and variations can be made in the configuration of the present invention without departing from the spirit or scope of the invention. It is intended that the present invention cover such modifications and variations provided they come within the scope of the appended claims or their equivalents.

What is claimed is:

1. A wiring distribution device for mounting to the top of an electronics cabinet or rack, comprising:
   a housing having a top, a bottom and side walls;
   a plurality of compartments formed in the housing for receiving electronic components, the compartments formed at discrete locations within the housing, at least one compartment including a cooling fan or passive convection cooling chimney designed to lower the temperature inside the cabinet, the cooling compartment including support walls mounted to the bottom of the housing about a hole formed in the bottom the walls configured to direct air past a fan mounted in the cooling compartment and toward an opening formed in the top;
   a wiring input point;
   a power distribution compartment mounted within one compartment adjacent to the wiring input point and on one side of the cooling compartment, the power distribution compartment mounted adjacent to an opening in the bottom for providing access to a power distribution component that is mounted within the compartment for supplying power to the cabinet;
   a power control zone located adjacent to the power distribution compartment for mounting of one or more circuit breakers, the power control zone also located adjacent to one of the housing walls for providing access to the switches of the circuit breakers; and
   a plurality of wiring output points for providing output of wires from the distribution device.

2. The device of claim 1, wherein the cooling compartment is located approximately in the center of the device, and wherein the cooling fan is arranged to draw ambient air from the interior of the cabinet and through the wiring distribution device.

3. The device of claim 1, wherein the housing includes at least one removable access panel so as to provide a user with access to the interior of the housing.

4. The device of claim 1, wherein the wiring input point is adapted to accept electrical power or signal interface wiring inputs for distribution to the electronic devices in the cabinet.

5. The device of claim 1, wherein the wiring output point is adapted to distribute electrical power or data signals to the electronic devices in the cabinet.

6. The device of claim 1, wherein at least one compartment includes a power-conditioning device for conditioning power supplied to the wire distribution device.

7. The device of claim 1, wherein at least one module is a power-supply device.

8. The device of claim 1, further comprising a monitoring module in the device including at least one display mounted to the housing and visible to a user from outside the housing, the display providing information indicative of the state of at least one component or the environment inside the cabinet.

9. The device of claim 8, wherein the display provides a visual indication of the temperature inside the rack or cabinet.

10. The device of claim 8, wherein the display provides graphical data or indicator lights depicting the status of the components in the cabinet or in the housing.

11. The device of claim 1, wherein at least one compartment channels audio wires into and out of the housing and another compartment contains a power supply, and wherein the compartment that channels the audio wires is located spaced as far apart from the compartment that contains the power supply as the housing permits so as to minimize interference.

12. The device of claim 1, wherein housing includes partitioning to separate class 1 and class 2 wiring for shielding the wires from electromagnetic interference.

13. A rack having an at least partially open top and electrical equipment contained within the rack, and a wiring distribution device according to claim 1 mounted to the top of the rack, the a power distribution component in the wiring distribution device electrically connected to the electrical equipment for supplying power to the equipment.

14. A wiring distribution device for mounting to the top of an electronics cabinet or rack, comprising:
   a housing having a top, a bottom, side walls, and at least one removable access panel so as to provide a user with access to the interior of the housing;
   a plurality of compartments formed in the housing for receiving electronic components, the compartments formed at discrete locations within the housing, at least one compartment including a cooling fan or passive convection cooling chimney designed to lower the temperature inside the cabinet, the cooling compartment including support walls mounted to the bottom of the housing about a hole formed in the bottom the walls configured to direct air past a fan mounted in the cooling compartment and toward an opening formed in the top, the cooling compartment being located approximately in the center of the device and arranged to draw ambient air from the interior of the cabinet and through the wiring distribution device;

a wiring input point;

a power distribution compartment mounted within one compartment adjacent to the wiring input point and on one side of the cooling compartment, the power distribution compartment mounted adjacent to an opening in the bottom for providing access to a power distribution component that is mounted within the compartment for supplying power to the cabinet;

a power control zone located adjacent to the power distribution compartment for mounting of one or more circuit breakers, the power control zone also located adjacent to one of the housing walls for providing access to the switches of the circuit breakers; and a plurality of wiring output points for providing output of wires from the distribution device;

wherein at least one compartment includes a power-conditioning device for conditioning power supplied to the wire distribution device.

* * * * *